United States Patent
Zhao

(10) Patent No.: US 11,665,923 B2
(45) Date of Patent: May 30, 2023

(54) DISPLAY PANEL AND METHOD FOR MANUFACTURING SAME

(71) Applicant: Wuhan China Star Optoelectronics Semiconductor Display Technology Co., Ltd., Wuhan (CN)

(72) Inventor: Heng Zhao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/757,407

(22) PCT Filed: Feb. 14, 2020

(86) PCT No.: PCT/CN2020/075295
§ 371 (c)(1),
(2) Date: Apr. 19, 2020

(87) PCT Pub. No.: WO2021/138958
PCT Pub. Date: Jul. 15, 2021

(65) Prior Publication Data
US 2022/0336774 A1    Oct. 20, 2022

(30) Foreign Application Priority Data
Jan. 8, 2020 (CN) .......................... 202010018649.1

(51) Int. Cl.
| H10K 50/844 | (2023.01) |
| H10K 71/20  | (2023.01) |
| H10K 71/00  | (2023.01) |
| H01L 51/52  | (2006.01) |
| H01L 51/00  | (2006.01) |
| H01L 51/56  | (2006.01) |

(52) U.S. Cl.
CPC ...... H01L 51/5253 (2013.01); H01L 51/0018 (2013.01); H01L 51/56 (2013.01)

(58) Field of Classification Search
None
See application file for complete search history.

(56) References Cited

U.S. PATENT DOCUMENTS

2020/0006704 A1* 1/2020 Zhang ................. H01L 51/0097
2021/0143364 A1* 5/2021 Jin ...................... H01L 51/5234

FOREIGN PATENT DOCUMENTS

| CN | 103413782 A | 11/2013 |
| CN | 108022878 A | 5/2018 |
| CN | 108666352 A | 10/2018 |
| CN | 109671858 A | 4/2019 |
| CN | 110010800 A | 7/2019 |
| CN | 110600511 A | 12/2019 |
| CN | 110600526 A | 12/2019 |

* cited by examiner

Primary Examiner — Richard H Kim
(74) Attorney, Agent, or Firm — PV IP PC; Wei Te Chung; Zhigang Ma

(57) ABSTRACT

Embodiments of the present disclosure provide a display panel and a method for manufacturing the same. In the embodiments, multiple layers in a functional area are removed through an etching process which is milder than a traditional cutting process and is not easy to introduce cracks into an inorganic material layer, so that a damage of components inside the display panel caused by moisture and oxygen is prevented, resulting in yield improvement of the display panel and cost saving.

12 Claims, 2 Drawing Sheets

- forming an array functional layer on a substrate — 101
- forming an encapsulation layer on the array functional layer — 102
- performing an etching process of the functional area of the encapsulation layer and the array functional layer to form a groove — 103

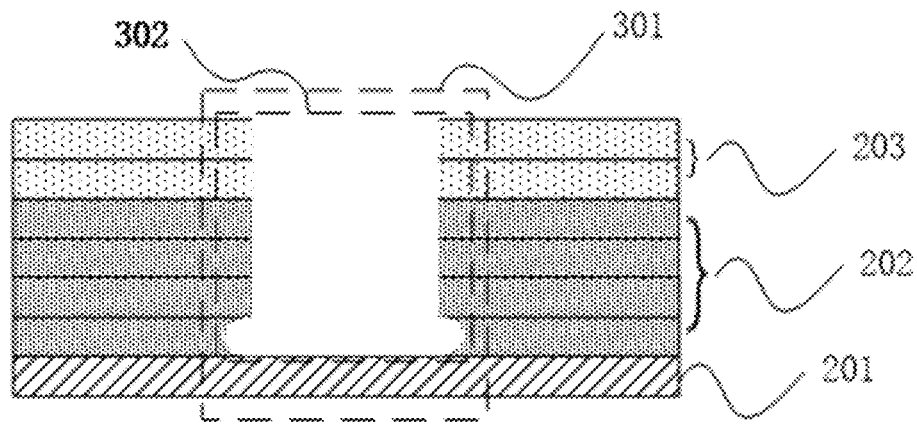
FIG. 3
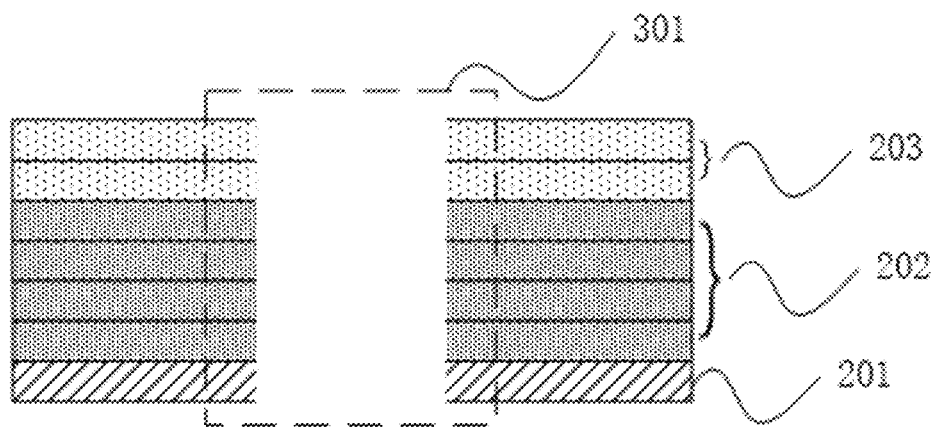
FIG. 4
cutting the organic layer and the substrate along an extending direction of the groove ~501
FIG. 5

DISPLAY PANEL AND METHOD FOR MANUFACTURING SAME

TECHNICAL FIELD

The present disclosure relates to the display technology field, and in particular, to a display panel and a method for manufacturing the same.

BACKGROUND

With development of information transmission technology and electronic products, organic light-emitting diode (OLED) display devices are more and more widely used due to their advantages of high brightness, fast response times, low energy consumption, and low cost. At present, full screens are a major development trend. In order to achieve a higher screen ratio, current solutions are provided, including screens with bang-shaped notches, screens with waterdrop-shaped notches, screens with holes, pop-up cameras, and even under-screen cameras. Among them, due to advantages of small opening holes and good uniformity of cameras and screens, the screens with holes look more complete and have stronger visual impact, which are a widely used overall screen solution.

However, traditional screens define holes through a cutting method. During the cutting method, it is easy to generate cracks, so that moisture and oxygen will penetrate into the device through the cracks, causing erosion to the light emitting materials and reducing lifespan of the screen.

SUMMARY

Embodiments of the present disclosure provide a method for manufacturing display panel. Multiple layers in a functional area are removed through an etching process which is milder than the traditional cutting process and is not easy to introduce cracks into an inorganic material layer, so that a damage of the components inside the display panel caused by moisture and oxygen is prevented, resulting in a yield improvement of the display panel and a cost saving.

In a first aspect, an embodiment of the present disclosure provides a method for manufacturing display panel, wherein the display panel comprises a functional area, and the method comprises forming an array functional layer on a substrate, forming an encapsulation layer on the array functional layer, and performing an etching process of the functional area of the encapsulation layer and the array functional layer to form a groove.

In some embodiments, the performing an etching process of the functional area of the encapsulation layer and the array functional layer comprises performing a dry etching process of the encapsulation layer and the array functional layer.

In some embodiments, the performing a dry etching process of the encapsulation layer and the array functional layer comprises covering the encapsulation layer through a mask, wherein a portion corresponding to the functional area of the mask is hollowed.

In some embodiments, the performing a dry etching process of the encapsulation layer and the array functional layer comprises performing the dry etching process of the encapsulation layer and the array functional layer through a fluoride gas.

In some embodiments, after the performing an etching process of the functional area of the encapsulation layer and the array functional layer to form a groove, the method comprises filling the groove with an organic layer.

In some embodiments, after the filling the groove with the organic layer, the method comprises cutting the organic layer and the substrate along an extending direction of the groove.

In some embodiments, the cutting the organic layer and the substrate comprises cutting the organic layer and the substrate through a laser cutting method.

In a second aspect, an embodiment of the present disclosure provides a display panel comprising a functional area, wherein the display panel further comprises a substrate, an array functional layer, and an encapsulation layer, a groove is formed in the functional area by a method as described in the first aspect.

In some embodiments, the encapsulation layer comprises a two-layered structure.

In some embodiments, the encapsulation layer comprises one or more of silicon nitride, silicon oxide, and silicon oxynitride.

In a third aspect, an embodiment of the present disclosure provides a method for manufacturing display panel, wherein the display panel comprises forming an array functional layer on a substrate, forming an encapsulation layer on the array functional layer, performing a dry etching process of the encapsulation layer and the array functional layer to form a groove, and filling the groove with an organic layer.

In some embodiments, the performing a dry etching process of the encapsulation layer and the array functional layer comprises covering the encapsulation layer through a mask, wherein a portion corresponding to the functional area of the mask is hollowed.

In some embodiments, the performing a dry etching process of the encapsulation layer and the array functional layer comprises performing the dry etching process of the encapsulation layer and the array functional layer through a fluoride gas.

In some embodiments, after the filling the groove with the organic layer, the method comprises cutting the organic layer and the substrate along an extending direction of the groove.

In some embodiments, the cutting the organic layer and the substrate comprises cutting the organic layer and the substrate through a laser cutting method.

The embodiments of the present disclosure provide the method for manufacturing display panel, wherein the display panel comprises the functional area, and the method comprises forming the array functional layer on the substrate, forming the encapsulation layer on the array functional layer, and performing the etching process of the functional area of the encapsulation layer and the array functional layer to form the groove. In the embodiments of the present disclosure, multiple layers in the functional area are removed through the etching process which is milder than the traditional cutting process and not easy to introduce cracks into the inorganic material layer, so that the damage of the components inside the display panel caused by moisture and oxygen is prevented, resulting in a yield improvement of the display panel and a cost saving.

BRIEF DESCRIPTION OF DRAWINGS

The technical solutions, as well as other beneficial advantages, of the present disclosure will be apparent from the following detailed descriptions of embodiments of the present disclosure, with reference to the attached drawings.

FIG. 3 is a schematic structural diagram illustrating the display panel in FIG. 2 after being processed by a step 103.

FIG. 4 is a schematic structural diagram illustrating the display panel in FIG. 3 after being processed by a step 501.

FIG. 5 is a schematic flow diagram illustrating another a method for manufacturing display panel according to an embodiment of the present disclosure.

DETAILED DESCRIPTION OF PREFERRED EMBODIMENTS

Figure 1:
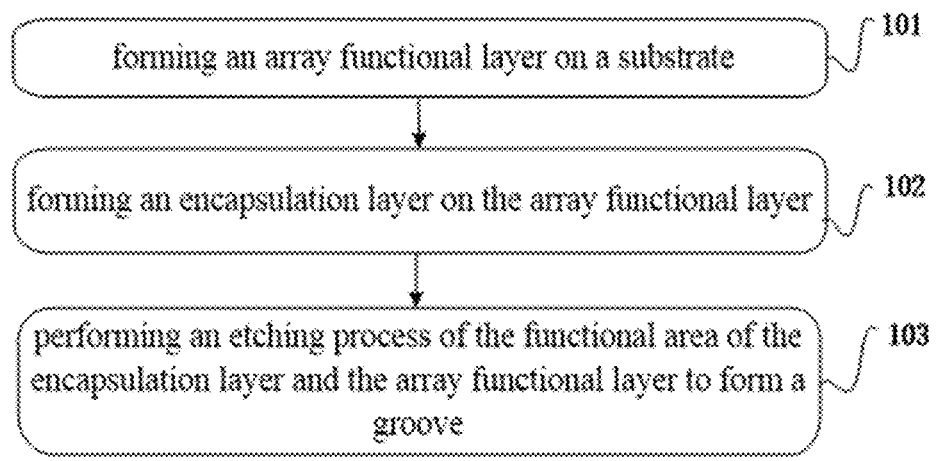
FIG. 1 is a schematic flow diagram illustrating a method for manufacturing display panel according to an embodiment of the present disclosure.

The technical solutions in the embodiments of the present disclosure will be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure.

In description of the disclosure, it should be understood that orientational or positional relationships represented by directional terms mentioned in the present disclosure, such as central, longitudinal, lateral, length, width, thickness, up, down, front, rear, left, right, vertical, horizontal, top, bottom, inside, outside, clockwise, anticlockwise, etc., are orientational or positional relationships based on the drawings, and are merely for the convenience of describing the present disclosure and simplifying the description, rather than indicating or implying that the device or element is intended to have a particular orientation, or is constructed and operated in a particular orientation, and therefore, should not be interpreted as a limitation of the application. In addition, terms such as "first" and "second" are used herein for purposes of description, and should not be interpreted as indication or implication of relative importance, or implied indication of a number of the technical features. Therefore, features limited by terms such as "first" and "second" can explicitly or impliedly include one or more than one of these features. In description of the disclosure, "a plurality of" means two or more than two, unless otherwise specified.

In the present disclosure, it is stated that, unless specified or limited otherwise, the terms "mounted," "connected," "coupled," "fixed" and the like are interpreted broadly, and may be, for example, fixed connections, detachable connections, or integral connections; may also be mechanical or electrical connections; may also be direct connections or indirect connections via intervening structures; may also be inner communications of two elements, which can be understood in the present disclosure by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Traditional screens define holes through a cutting method. During the cutting method, it is easy to generate cracks, so that moisture and oxygen will penetrate into the device through the cracks, causing erosion to the light emitting materials and reducing lifespan of the screen.

Based on that, embodiments of the present disclosure provide a display panel and a method for manufacturing the same, and will be described in detail as below.

First, an embodiment of the present disclosure provides a method for manufacturing display panel, wherein the display panel comprises a functional area, the method comprises forming an array functional layer on a substrate, forming an encapsulation layer on the array functional layer, and performing an etching process of the functional area of the encapsulation layer and the array functional layer to form a groove.

Figure 2:
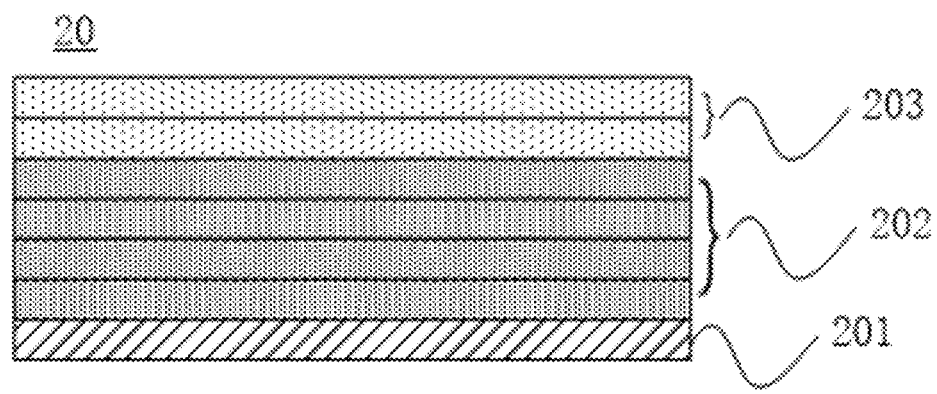
FIG. 2 is a schematic structural diagram illustrating a display panel according to an embodiment of the present disclosure.

In detail, please refer to FIGS. 1 to 4, wherein FIG. 1 is a schematic flow diagram illustrating a method for manufacturing display panel according to an embodiment of the present disclosure, FIG. 2 is a schematic structural diagram illustrating a display panel according to an embodiment of the present disclosure, FIG. 3 is a schematic structural diagram illustrating the display panel in FIG. 2 after being processed by a step 103, and FIG. 4 is a schematic structural diagram illustrating the display panel in FIG. 3 after being processed by a step 501. The display panel comprises a functional area, and the method comprises:

101, forming an array functional layer on a substrate.

In the embodiment, the substrate 201 can be a rigid substrate or a flexible substrate, wherein a material of the rigid substrate can comprise glass and a material of the flexible substrate can comprise polyimide. Specifically, in some embodiments, two flexible substrates are used as the substrate of the display panel for a better structure of the flexible substrate. During a manufacturing process, a glass substrate is provided first, then processed through cleaning and drying processes to remove impurities on the substrate such as ash. Then an adhesive is coated on the glass substrate, and a flexible substrate material is coated on the adhesive to form the flexible substrate through curing the flexible substrate. The adhesive is cured to adhere the flexible substrate onto the glass substrate.

In the embodiment, the array functional layer can comprise layers such as a buffer layer, a gate insulation layer, and an interlayer insulation layer.

102, forming an encapsulation layer on the array functional layer.

In the embodiment, the encapsulation layer 203 comprises a chemical vapor phase layer. The chemical vapor phase layer comprises one or more of silicon nitride, silicon oxide, and silicon oxynitride.

103, performing an etching process of the functional area of the encapsulation layer and the array functional layer to form a groove.

In the embodiment, FIG. 3 is a schematic structural diagram illustrating the display panel in FIG. 2 after being processed by a step 103. The functional area 301 of the encapsulation layer and the array functional layer 202 is etched to form the groove 302.

In the embodiment, multiple layers in the functional area are removed through the etching process which is milder than the traditional cutting process and is not easy to introduce cracks into the inorganic material layer, so that a damage of the components inside the display panel caused by moisture and oxygen is prevented, resulting in yield improvement of the display panel and cost savings.

It should be noted that descriptions of the method for manufacturing display panel in the above embodiments only disclose the above steps. While it can be understood that any other necessary steps as required and besides the above steps can be included in the descriptions of the method for manufacturing display panel in the embodiments. For example, layers of light emitting element can be formed on an array substrate after the array substrate is manufactured. It is not limited hereto.

The array substrate comprises thin film transistors distributed in array, wherein the thin film transistor (TFT) is a kind of the field effect transistor. A general manufacturing method comprises depositing various layers on the substrate such as a semiconductor active layer, a dielectric layer, and a metal electrode layer. The thin film transistor plays an important role in performance of the display device.

In some embodiments, the performing an etching process of the functional area of the encapsulation layer and the array functional layer comprises performing a dry etching process of the encapsulation layer and the array functional layer.

In the embodiment, the etching process is a technology to remove materials by chemical reactions or physical impacts. The etching technology can be classified into a wet etching technology and a dry etching technology. Due to the dry etching process having advantages of strong etching orientation, accurate process control, convenience, no adhesive failure, and no substrate damage and contamination, the dry etching process is chosen in the embodiment. A gas used in the dry etching process is called an etching gas.

In some embodiments, the performing a dry etching process of the encapsulation layer and the array functional layer comprises covering the encapsulation layer through a mask, wherein a portion corresponding to the functional area of the mask is hollowed.

In some embodiments, the performing a dry etching process of the encapsulation layer and the array functional layer comprises performing the dry etching process of the encapsulation layer and the array functional layer through a fluoride gas.

In the embodiment, the fluoride gas can comprise carbon tetrafluoride, trifluoride gas, hexafluoroethane, perfluoropropane, or trifluoromethane.

In the embodiment, some layers of the encapsulation layer and the array functional layer can comprise an inorganic material such as silicon nitride, silicon oxide, and silicon oxynitride. Therefore, the fluoride gas can be used to perform the dry etching process of the encapsulation layer and the array functional layer. Specifically, a raw material of fluoride gas is introduced into the etching machine to be dissociated to obtain fluoride ions, etching the encapsulation layer and the array functional layer in the functional area to form the groove.

In some embodiments, because the flexible substrate comprises an organic material which cannot be etched during the etching process, at this time, fluoride ions for etching may be stored on the flexible substrate, so that sides of the buffer layer on the flexible substrate and surrounding the groove will be etched, resulting in an active portion of the buffer layer being etched. Therefore, in order to make up for the etched active portion of the buffer layer, after the performing an etching process of the functional area of the encapsulation layer and the array functional layer to form a groove, the method comprises filling the groove with an organic layer.

In the embodiment, the organic layer comprises a light curable adhesive and is not limited hereto.

In some embodiments, please refer to FIG. 5 which is a schematic flow diagram illustrating another a method for manufacturing display panel according to an embodiment of the present disclosure, wherein after the filling the groove with the organic layer, the method comprises:

501, cutting the organic layer and the substrate along an extending direction of the groove.

In the embodiment, the cutting object only consist of the organic layer, the flexible substrate, and the glass substrate at this time, and not consist of the chemical vapor phase layer, so that cutting cracks resulting in penetration of moisture will not be generated, effectively improving product yield and lifespan.

In some embodiments, the cutting the organic layer and the substrate comprises cutting the organic layer and the substrate through a laser cutting method.

In the embodiment, the laser cutting method is achieved by energy with high power density generated by a focused laser. Under control of a computer, a laser device is discharged by a pulse to output a controlled pulse laser with a repeated high frequency, forming a beam with a certain frequency and a certain pulse width. The pulse laser beam is focused on a surface of a processing object to form subtle focal spots with high energy densities through light path transmission, reflection, and focusing lens groups. The focal spots are located near a processing surface to process a processed material by instantaneous high-temperature melting or gasification.

Each high-energy pulse laser defines a tiny hole on the surface of the object by sputtering immediately. Under control of a computer, a laser head and the processed material continuously move relative to each other according to a pre-drawn figure, thus the object will be processed into a desired shape. When cutting, coaxial airflow with the beam is ejected from the cutting head, blowing the molten or vaporized material out from a bottom of an incision.

Compared with a traditional plate processing method, the laser cutting method has advantages of high cutting quality (small incision width, small heat affected area, clean incision), high cutting speed, good flexibility (can be cut into any shape at will), and a wide range of material adaptability.

In other aspect, an embodiment of the present disclosure provides a display panel. Please refer to FIGS. 2 to 4, the display panel 20 comprises a functional area, wherein the display panel 20 further comprises a substrate 201, an array functional layer 202, and an encapsulation layer 203, a groove 302 is formed in the functional area by the method for manufacturing display panel as described in the above embodiments.

In some embodiments, components of the array substrate of the display panel is easily damaged by moisture and oxygen in air. Therefore, in order to prevent damage of the components of the array substrate by moisture and oxygen in air, the encapsulation layer 203 comprises a two-layered structure.

In some embodiments, the encapsulation layer 203 comprises one or more of silicon nitride, silicon oxide, and silicon oxynitride.

It should be noted that descriptions of the display panel in the above embodiments only disclose the above structures. While it can be understood that any other necessary structures as required and besides the above structures can be included in the descriptions of the display panel in the embodiments, such as a gate insulation layer and an interlayer insulation layer. It is not limited hereto.

In the foregoing embodiments, the description of each of the embodiments has respective focuses. For a part that is not described in detail in an embodiment, reference may be made to relevant descriptions in other embodiments. Details are not further described herein.

The display panel and the method for manufacturing the same provided in the embodiments of the present disclosure are described in detail above. The principle and implementations of the present disclosure are described in this specification by using specific examples. The description about the foregoing embodiments is merely provided to help understand the method and core ideas of the present disclosure. Persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A method for manufacturing display panel, wherein the display panel comprises a functional area, and the method comprises:
    forming an array functional layer on a substrate;
    forming an encapsulation layer on the array functional layer; and
    performing an etching process of the functional area of the encapsulation layer and the array functional layer to form a groove,
    wherein after performing the etching process of the functional area of the encapsulation layer and the array functional layer to form the groove, the method comprises filling the groove with an organic layer; and after filling the groove with the organic layer, the method comprises cutting the organic layer and the substrate along an extending direction of the groove.

2. The method for manufacturing display panel as claimed in claim 1, wherein the performing an etching process of the functional area of the encapsulation layer and the array functional layer comprises performing a dry etching process of the encapsulation layer and the array functional layer.

3. The method for manufacturing display panel as claimed in claim 2, wherein the performing a dry etching process of the encapsulation layer and the array functional layer comprises covering the encapsulation layer through a mask, wherein a portion corresponding to the functional area of the mask is hollowed.

4. The method for manufacturing display panel as claimed in claim 2, wherein the performing a dry etching process of the encapsulation layer and the array functional layer comprises performing the dry etching process of the encapsulation layer and the array functional layer through a fluoride gas.

5. The method for manufacturing display panel as claimed in claim 1, wherein the cutting the organic layer and the substrate comprises cutting the organic layer and the substrate through a laser cutting method.

6. A display panel comprising a functional area, wherein the display panel further comprises a substrate, an array functional layer, and an encapsulation layer, wherein a groove is formed in the functional area of the encapsulation layer and the array functional layer.

7. The display panel as claimed in claim 6, wherein the encapsulation layer comprises a two-layered structure.

8. The display panel as claimed in claim 7, wherein the encapsulation layer comprises one or more of silicon nitride, silicon oxide, and silicon oxynitride.

9. A method for manufacturing display panel, wherein the display panel comprises a functional area, and the method comprises:
    forming an array functional layer on a substrate;
    forming an encapsulation layer on the array functional layer;
    performing a dry etching process of the encapsulation layer and the array functional layer to form a groove; and
    filling the groove with an organic layer,
    wherein after filling the groove with the organic layer, the method comprises cutting the organic layer and the substrate along an extending direction of the groove.

10. The method for manufacturing display panel as claimed in claim 9, wherein the performing a dry etching process of the encapsulation layer and the array functional layer comprises covering the encapsulation layer through a mask, wherein a portion corresponding to the functional area of the mask is hollowed.

11. The method for manufacturing display panel as claimed in claim 9, wherein the performing a dry etching process of the encapsulation layer and the array functional layer comprises performing the dry etching process of the encapsulation layer and the array functional layer through a fluoride gas.

12. The method for manufacturing display panel as claimed in claim 9, wherein the cutting the organic layer and the substrate comprises cutting the organic layer and the substrate through a laser cutting method.

* * * * *